(12) United States Patent
Lin et al.

(10) Patent No.: US 7,135,943 B2
(45) Date of Patent: Nov. 14, 2006

(54) DIPLEXER FORMED IN MULTI-LAYERED SUBSTRATE

(75) Inventors: Yo-Shen Lin, Taipei (TW); Ko-Mai Li, Taipei (TW)

(73) Assignee: Chi Mei Communication Sytems, Inc., Tai-Nan County (TW)

(*) Notice: Subject to any disclaimer, the term of this patent is extended or adjusted under 35 U.S.C. 154(b) by 46 days.

(21) Appl. No.: 10/710,437

(22) Filed: Jul. 11, 2004

(65) Prior Publication Data

US 2006/0006960 A1   Jan. 12, 2006

(51) Int. Cl.
 *H03H 7/46* (2006.01)
(52) U.S. Cl. .................. 333/132; 333/100; 333/185
(58) Field of Classification Search ............ 333/100, 333/110, 132, 185
 See application file for complete search history.

(56) References Cited

U.S. PATENT DOCUMENTS

| | | | |
|---|---|---|---|
| 5,880,649 A | 3/1999 | Tai et al. | |
| 6,097,268 A | 8/2000 | Watanabe et al. | |
| 6,366,564 B1* | 4/2002 | Hiraka et al. | 370/275 |
| 6,563,396 B1* | 5/2003 | Tanaka et al. | 333/133 |
| 6,677,833 B1 | 1/2004 | Sheen | |
| 6,734,767 B1* | 5/2004 | Vanoverschelde et al. | 333/214 |
| 6,876,840 B1* | 4/2005 | Shin et al. | 455/280 |
| 6,911,708 B1* | 6/2005 | Park | 257/416 |
| 6,927,648 B1* | 8/2005 | Furuya et al. | 333/132 |

\* cited by examiner

*Primary Examiner*—Robert Pascal
*Assistant Examiner*—Kimberly Glenn
(74) *Attorney, Agent, or Firm*—Jeffrey T. Knapp

(57) ABSTRACT

A lumped-element diplexer formed in a multi-layered substrate includes a high-pass filter circuit, a low-pass filter circuit, and a ground plane, the elements of the filter circuits being disposed as follows: a first capacitor plate on a first layer of the substrate connected to a first port and a first inductor plate on a third layer, a second capacitor plate on a second layer of the substrate connected to the first inductor plate and a third capacitor plate on a fourth layer, the third capacitor plate in turn being connected to a second port. A fourth capacitor plate on a fifth layer of the substrate is connected to a second inductor plate on a seventh layer, the second inductor plate in turn being connected to the ground plane on a zeroth layer. A fifth capacitor plate on a sixth layer of the substrate is connected to a third port.

13 Claims, 16 Drawing Sheets

A diplexer application

US 7,135,943 B2

DIPLEXER FORMED IN MULTI-LAYERED SUBSTRATE

BACKGROUND OF INVENTION

1. Field of the Invention

The present invention relates to a lumped-element diplexer used in the field of communications, and more particularly, to a lumped-element diplexer realized in a multi-layered substrate.

2. Description of the Prior Art

If any one trend has been constant throughout the development of mobile phone handsets, it's that they have continued to become more compact while offering improvements in both functionality and utility. In order to progress from the veritable house-bricks of the nineteen eighties, the components used in communication systems design have had to shrink in terms of both physical size and power consumption. Surface mount technology and advances in microchip, power cell and display design have all played their part, nevertheless, manufacturers continue to place emphasis on, and devote considerable resources to, the miniaturization of each and every component required to make a mobile phone handset.

Diplexers are widely used as building blocks in communication systems design. A diplexer is a three terminal device for separating signals of different frequencies or frequency bands, to different ports. They are commonly used in multi-band communication systems as band-separators (please see FIG. 1). For example, in mobile phone handsets designed to work under the GSM900/DCS1800 dual-band system, a diplexer 100 is usually adopted to connect the common dual-band antenna 101 and the relevant Radio Frequency (RF) circuits 102 & 103 for the GSM900 and DCS1800 frequency bands.

Diplexer performance is characterized in the following terms: insertion loss, guard band, isolation, and out-of-band rejection. Insertion loss is generally taken to mean the negative effect that the diplexer itself has on the signal it is processing, in terms of signal strength and loss thereof. The origins of this term are in transmission line theory and insertion loss is generally expressed in decibels (dB). The term guard band, in this application at least, refers to the bandwidth that lies between the frequency bands of interest. For example, in the case of the GSM900/DCS1800 dual-band mobile phone system, the guard band will be the band of frequencies between 960 MHz and 1710 MHz. The term isolation can be regarded as the devices ability to separate frequency bands cleanly, i.e. without the occurrence of internal cross-talk leading to output of mixed signals at the output ports. Out-of-band rejection, as the name suggests, is the ability of the diplexer to reject signals at frequencies outside of the frequency bands of interest.

Generally implemented using some of the common building blocks of RF signal conditioning, such as high-pass, low-pass, band-stop and band-pass filters, many configurations of diplexers have been proposed; they can be implemented using two band-stop filters, two band-pass filters, or one low-pass and one high-pass filter. For applications where the two frequency bands to be separated are not close, such as the GSM900/1800 mobile phone application, the low-pass/high-pass filter combination is preferable for its ease of implementation, lower insertion loss, and good rejection performance. Further improvement of diplexer rejection performance can be accomplished by introducing additional band-stop or notch filters after the low-pass and high-pass filter, as proposed by U.S. Pat. No. 5,880,649, which is included herein by reference.

In order to minimize circuit size, diplexers can be realized as lumped-elements formed in a multi-layered substrate. FIGS. 2 thru 9 show elements typically found in diplexers, these being such reactive components as capacitors and inductors, implemented a multi-layered substrate of the prior art. The layers of FIGS. 2 thru 9 are layered by the numerical order of the figure numbers. Here, the inductors are realized by 'meandering' metal strips (items 201, 501 & 801 being examples) while capacitors are formed between metal plates (items 302, 702, 703 and 802 being examples) on different layers. Significantly, in the implementation shown, the capacitive and inductive elements are separated by ground planes (see FIGS. 4, 6 & 9), which are included to reduce the effects of parasitic mutual couplings between the elements. However, this arrangement brings its own problems in that, not only does the inclusion of ground planes take up precious space, but it also introduces the problem of parasitic capacitance occurring between the reactive elements and the ground planes themselves. In addition, on several layers of the prior art diplexer layout there are more than one circuit component (FIG. 2, 7 & 8 refer), this will also increase the required circuit area.

With the advent of so called third generation or 3G technologies, there seems to be no immediate possibility of discontinued demand for miniaturized components, on the contrary, there is every indication that the communications industry will continue to demand improved performance from smaller and smaller packages for some time to come. Hence, there is a clear need for the development of increasingly compact diplexers, along with other communications components.

SUMMARY OF INVENTION

It is an object of the present invention to provide a lumped-element diplexer of compact design for mobile communications application, formed in a multi-layered substrate.

In order to accomplish the object of the present invention, the present invention provides a three-port diplexer device capable of separating mixed RF signals from a common, dual frequency antenna, into predetermined frequency bands for processing by RF circuits in a mobile communications application.

Comprising of contiguous layers of metal elements separated by a dielectric material, the diplexer includes a high-pass filter circuit, a low-pass filter circuit, and a ground plane, the elements of the filter circuits being orientated horizontally with respect to the ground plane and are arranged to form a vertical column or stack atop the ground plane. Interconnection between the layers is accomplished by a system of vias; three terminals known as ports are use to connect the device to an antenna and RF processing circuits. A mixed signal input from the antenna is fed to both diplexer filter circuits. The low-pass filter circuit will reject frequencies on the high side of its selection band, rolling off sharply into a notch, or region of high rejection, coinciding with the selection band of the high-pass filter. Conversely, the high-pass filter circuit will reject frequencies on the low side of its selection band The diplexer circuits comprise of at least a first capacitor plate disposed on a first layer of the substrate connected to a first port and a first strip inductor directly disposed on a third layer of the substrate. A second capacitor plate disposed on a second layer of the substrate is connected to the first strip inductor and a third capacitor plate directly disposed on a fourth layer of the substrate, the third capacitor plate in turn being connected to a second port. Furthermore, a fourth capacitor plate disposed on a fifth layer of the substrate is connected to a second strip inductor directly disposed on a seventh layer of the substrate, the second strip inductor in turn being connected to the ground plane disposed on the zero layer of the substrate. A fifth capacitor plate disposed on a sixth layer of the substrate is connected to a third port.

It is an advantage of the present invention that a reduction in packaging size is achieved by virtue of the arrangement of circuit elements.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
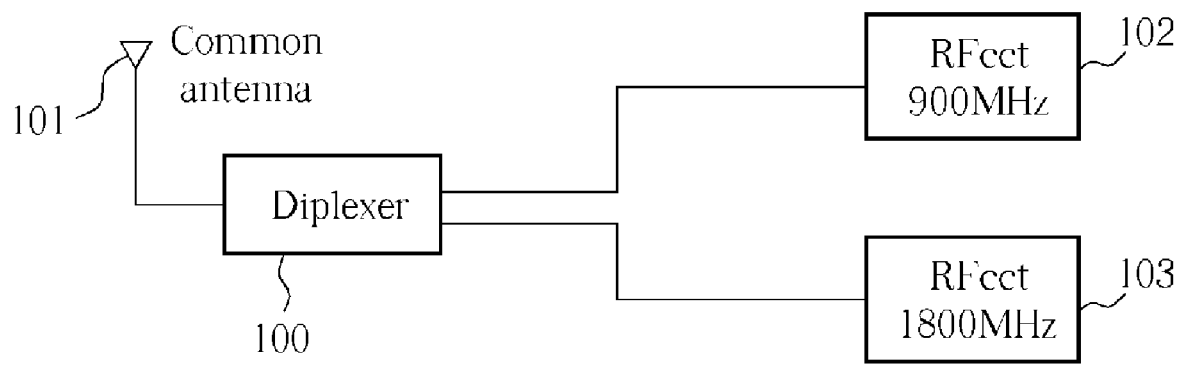
FIG. 1 shows a simple schematic diagram of a conventional diplexer used in a mobile phone application.
Figure 2:
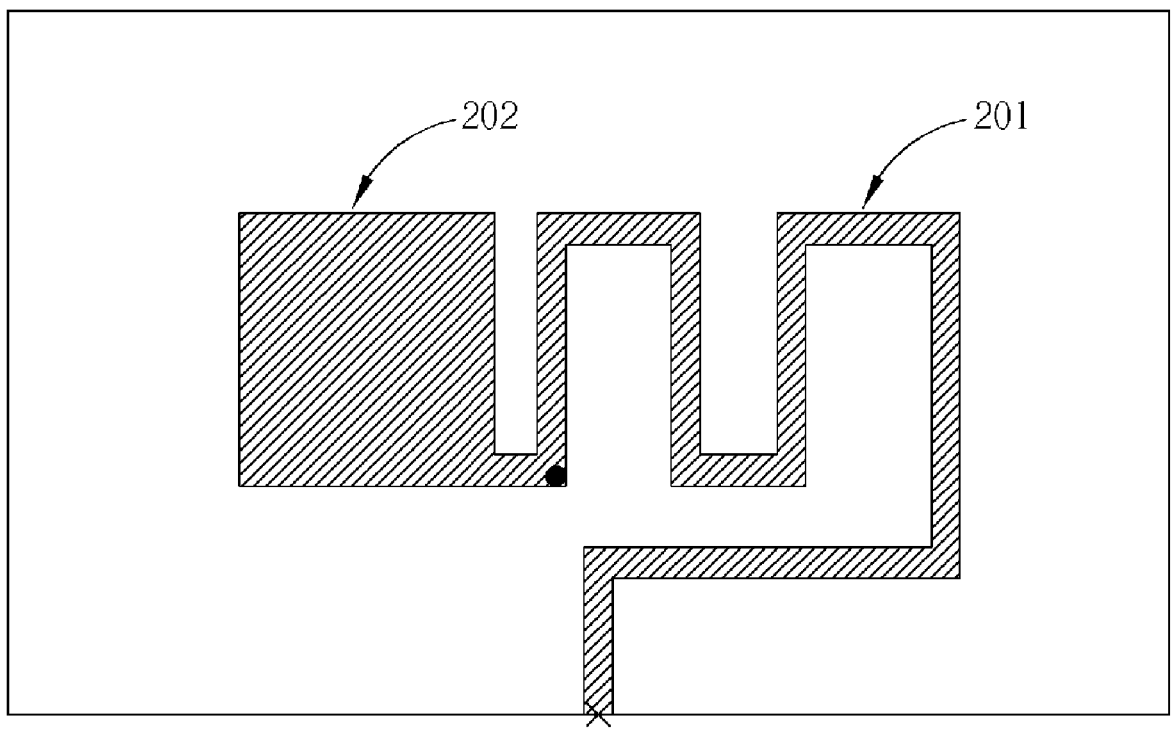
FIGS. 2–9 shows plan views of the various layers of a prior art multi-layered substrate diplexer.
Figure 3:
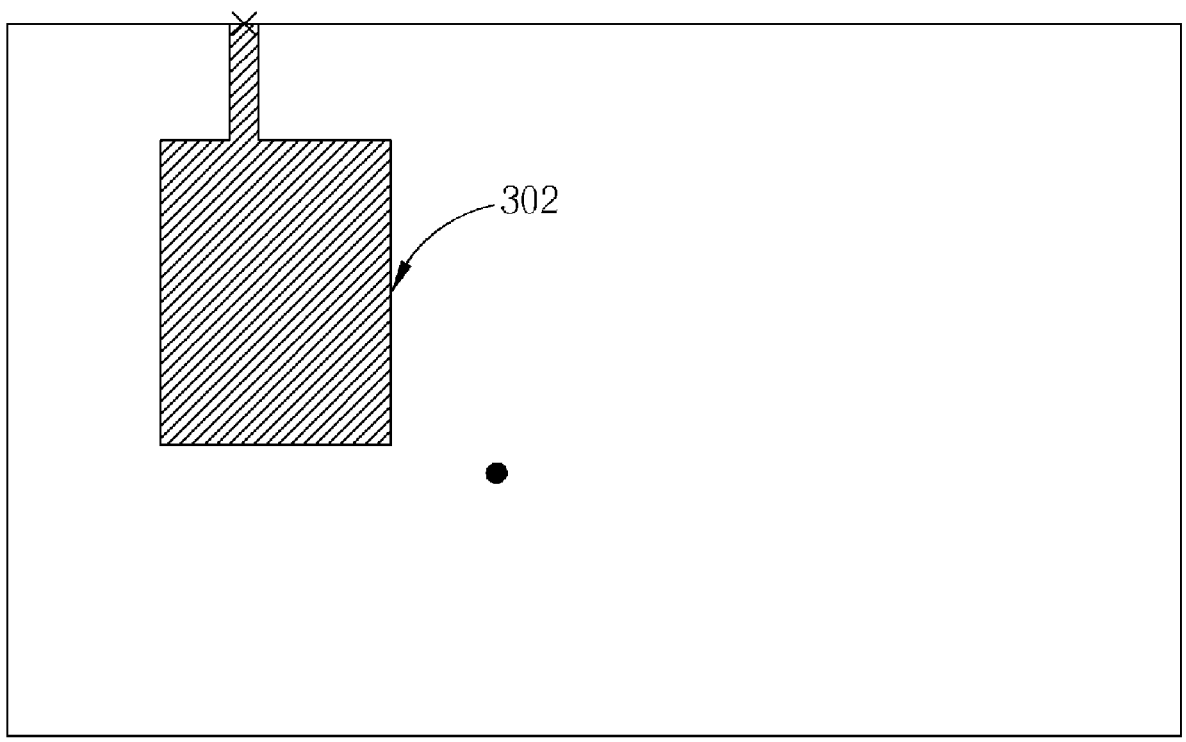
Figure 4:
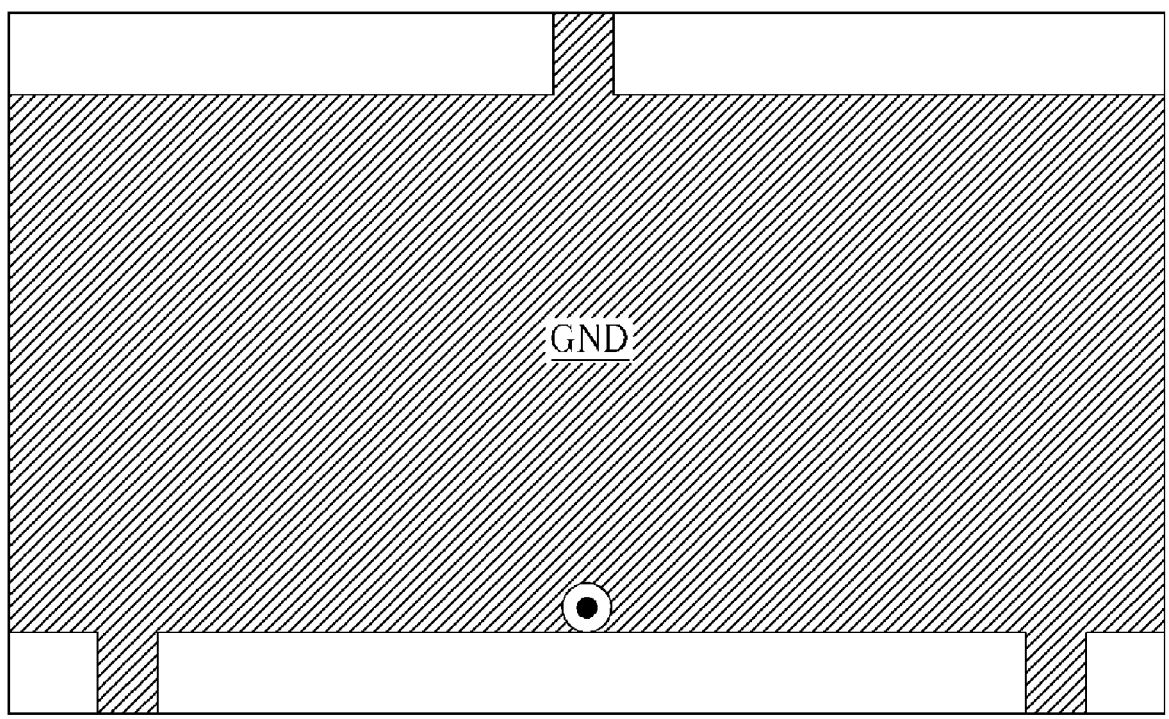
Figure 5:
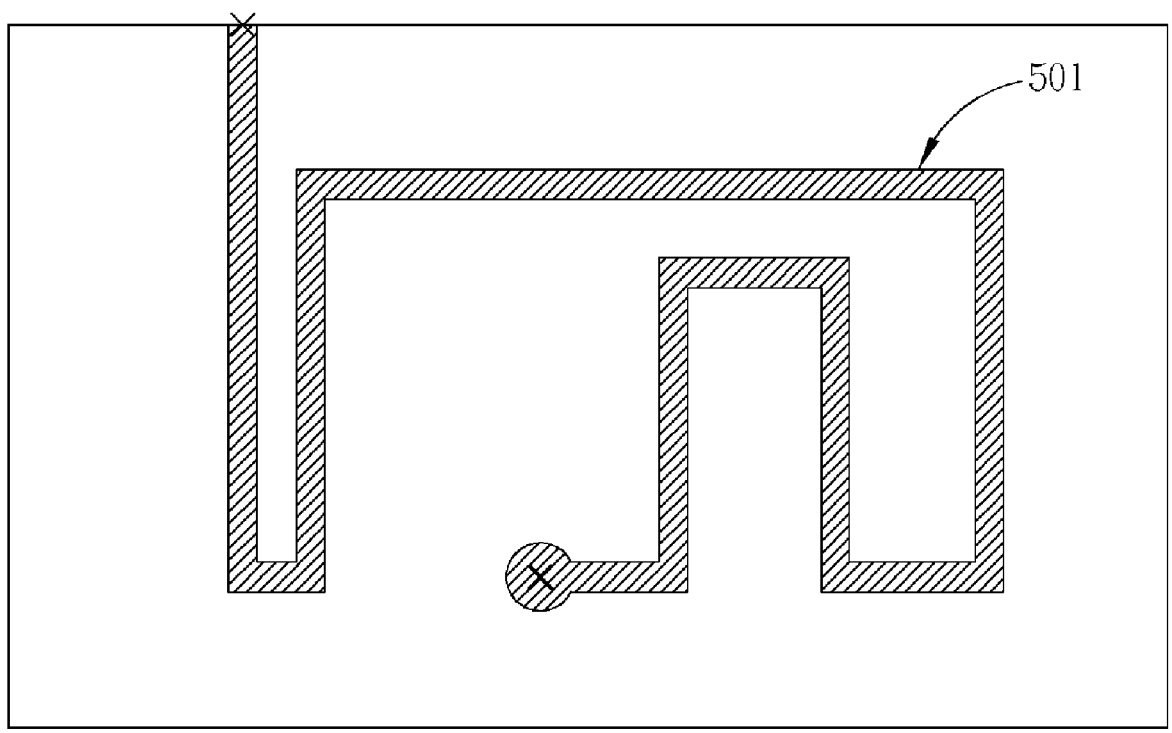
Figure 6:
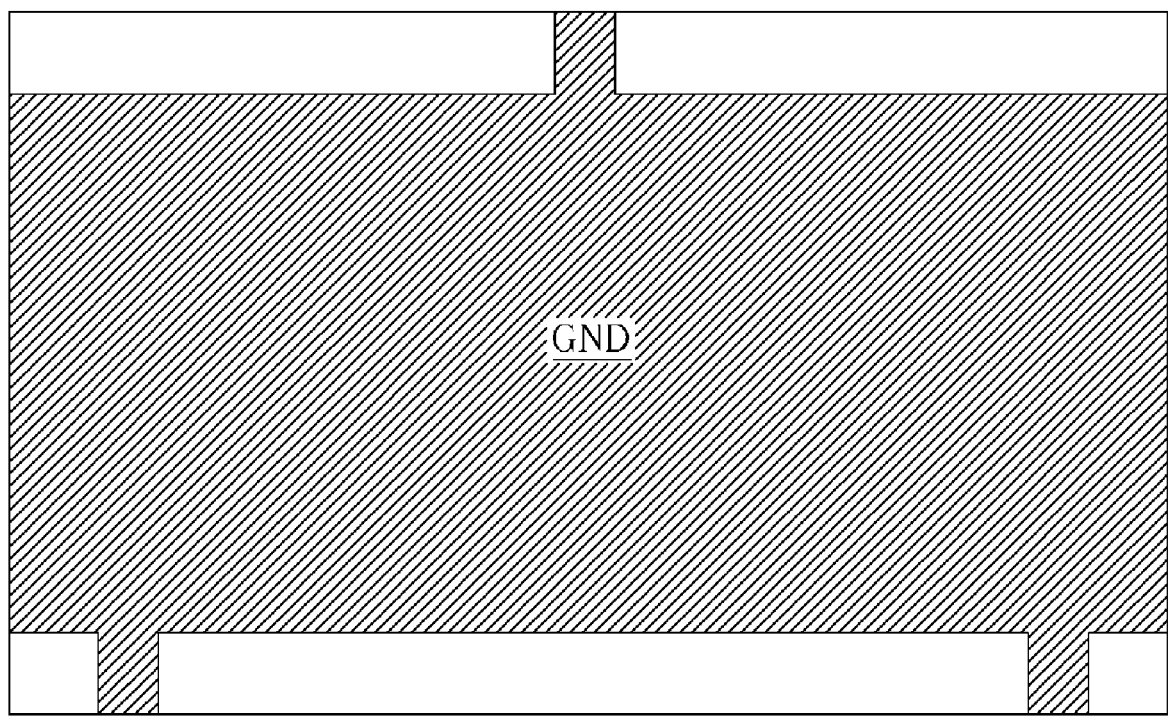
Figure 7:
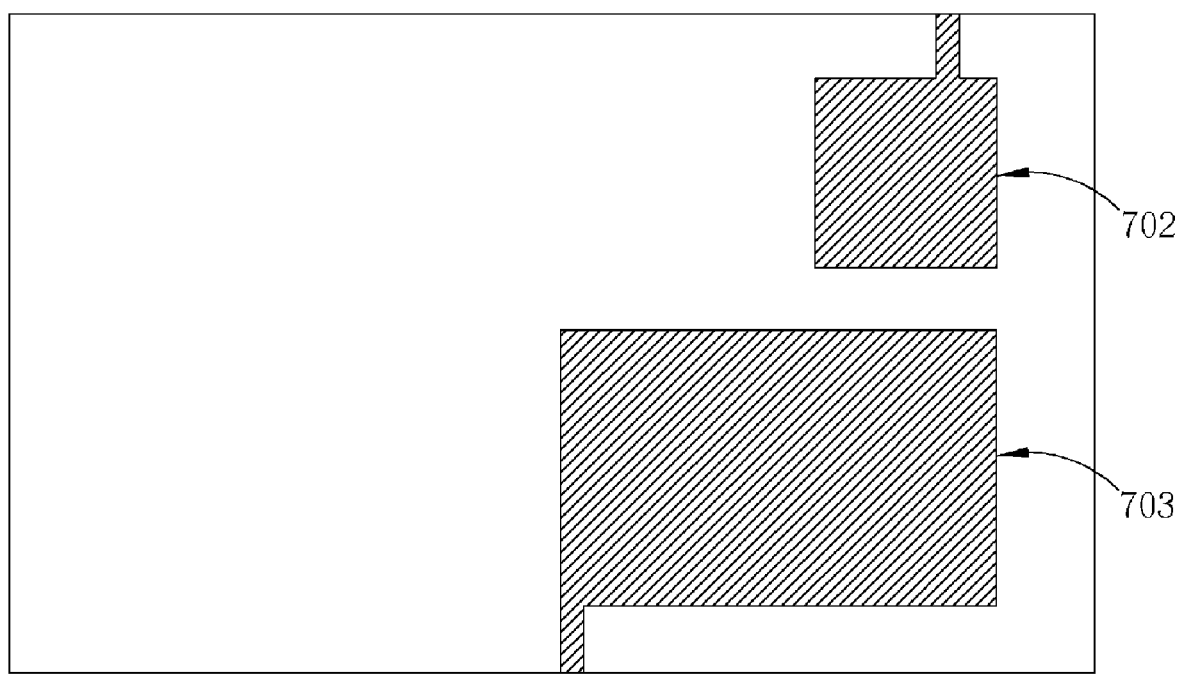
Figure 8:
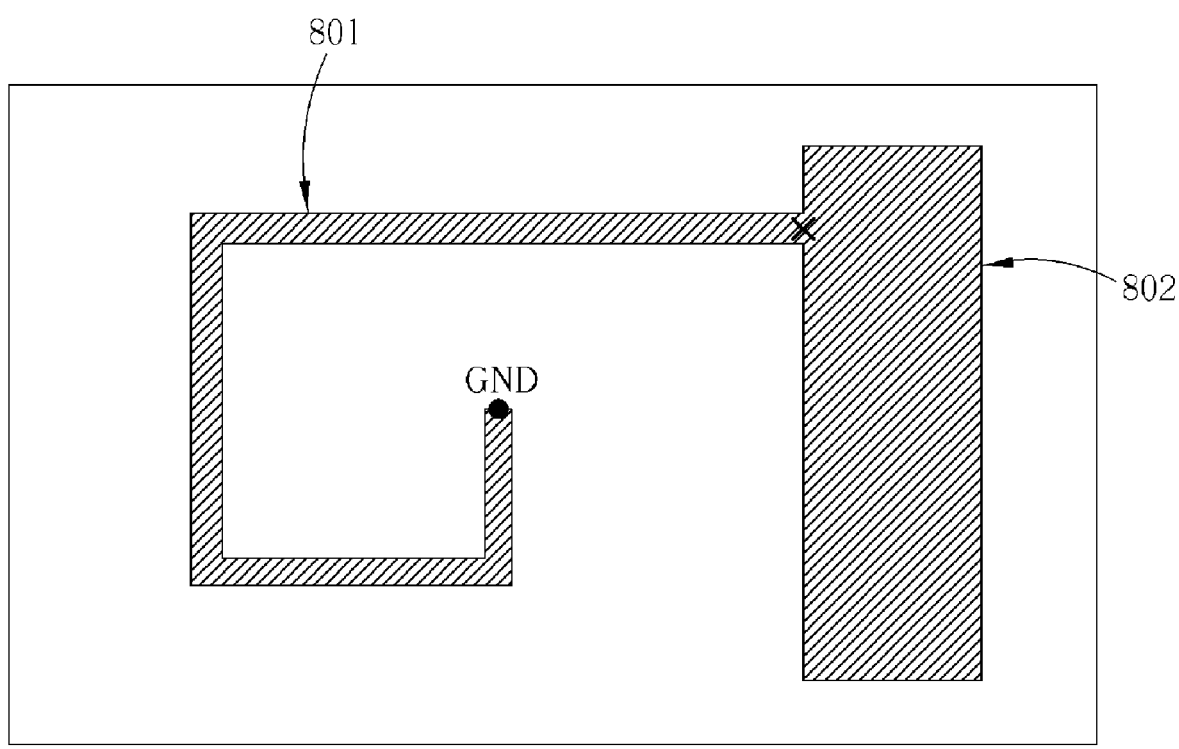
Figure 9:
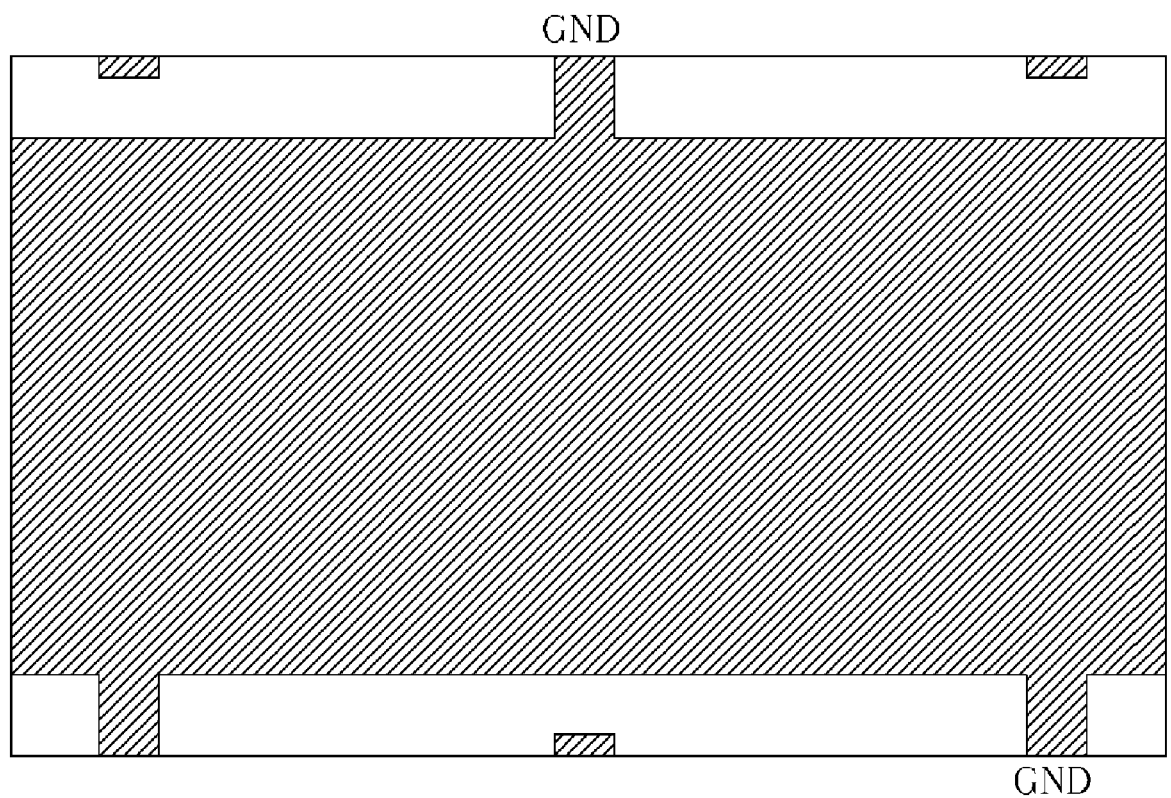
Figure 10:
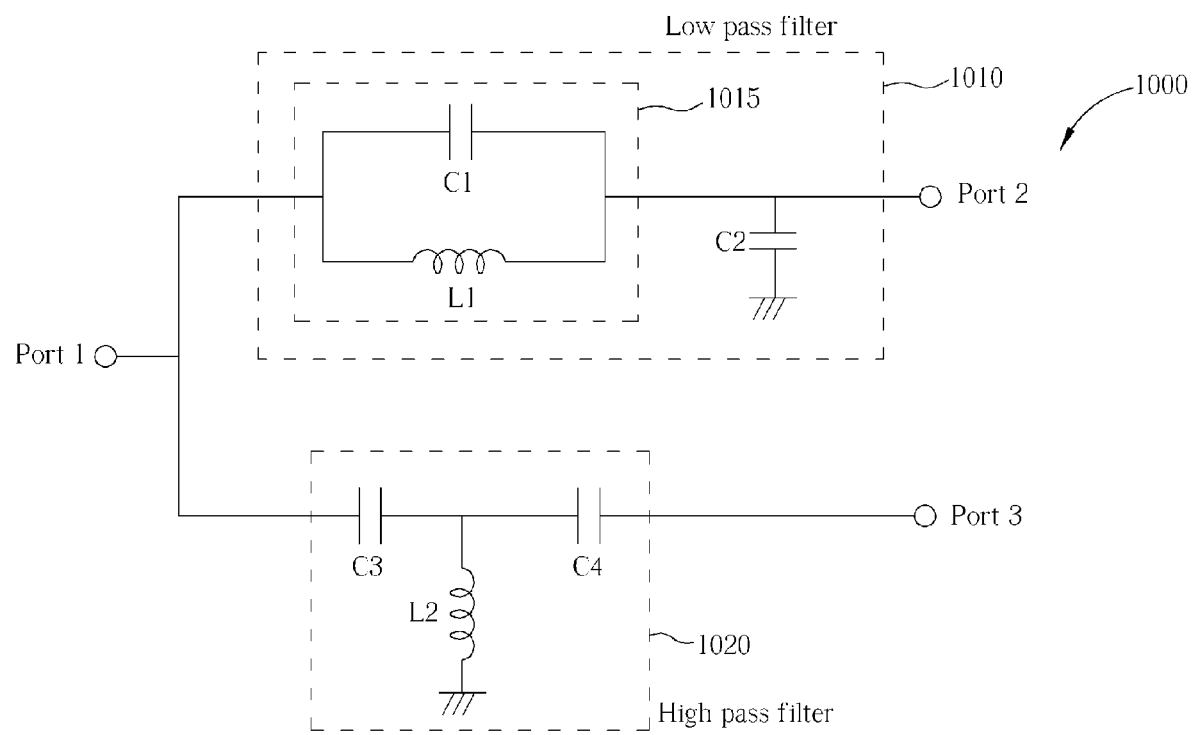
FIG. 10 shows a circuit diagram of a circuit model of the present invention.

Shown in FIG. 10 is the circuit model of a first embodiment of a present invention lumped-element diplexer 1000. It comprises a low-pass section 1010 and a high-pass section 1020 that are connected to a common terminal Port 1, so as to separate a low frequency band from a high frequency band, given a mixed signal input. The low-pass section 1010, being connected between the common terminal Port 1 and a low frequency output terminal Port 2, includes a parallel LC resonant circuit 1015 comprising a capacitor C1 and an inductor L1, followed by a shunt capacitor C2. The resonant frequency of the parallel LC circuit 1015 is designed at the frequency of a high frequency band, such that it presents an effective open circuit to the high frequency band and isolation can be improved. The high-pass filter 1020, being connected between the common terminal Port 1 and a high frequency output terminal Port 3, includes two series capacitors, C3 & C4, together with an intermediately placed shunt inductor L2.

Figure 11:
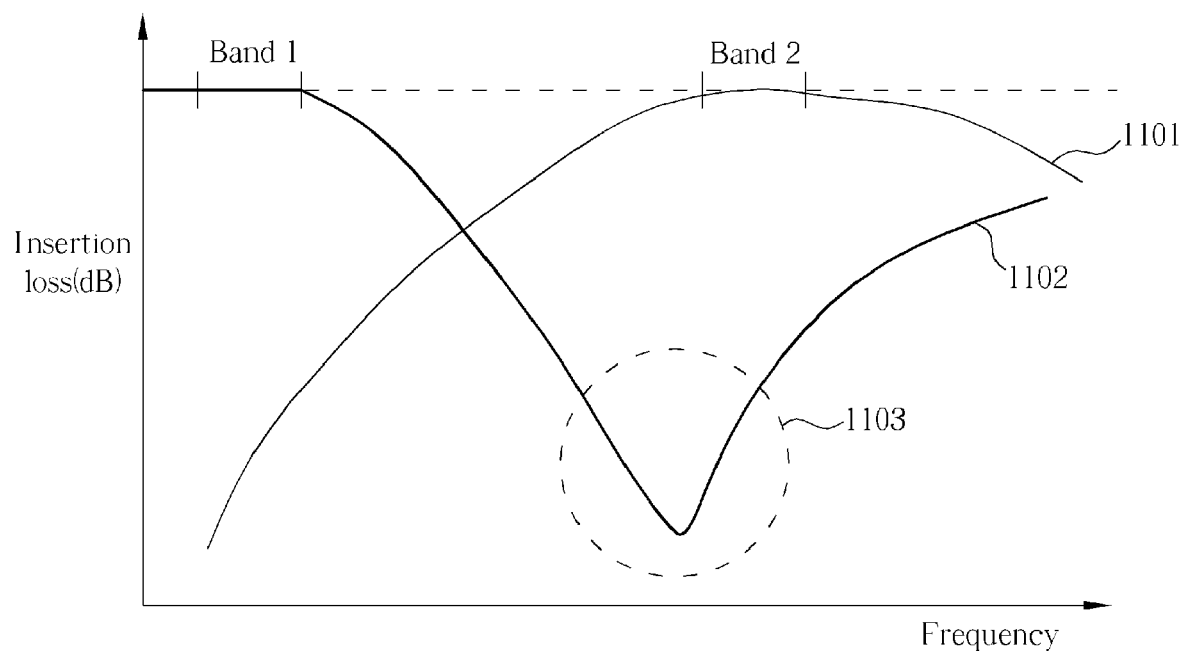
FIG. 11 shows a graph of typical frequency response of the diplexer embodiment of FIG. 10.

Shown in FIG. 11 is the typical frequency response of the first diplexer embodiment in FIG. 10. Note that the notch 1103 in the insertion loss response of the low-pass section 1102, which is achieved by the parallel LC circuit 1015, greatly improves isolation between the low-pass 1010 and high-pass 1020 sections.

In order to minimize the circuit size, the first diplexer embodiment is preferably realized by lumped-elements formed in a multi-layered substrate. In addition, the circuit elements are stacked such that the required circuit area can further be minimized.

Figure 12:
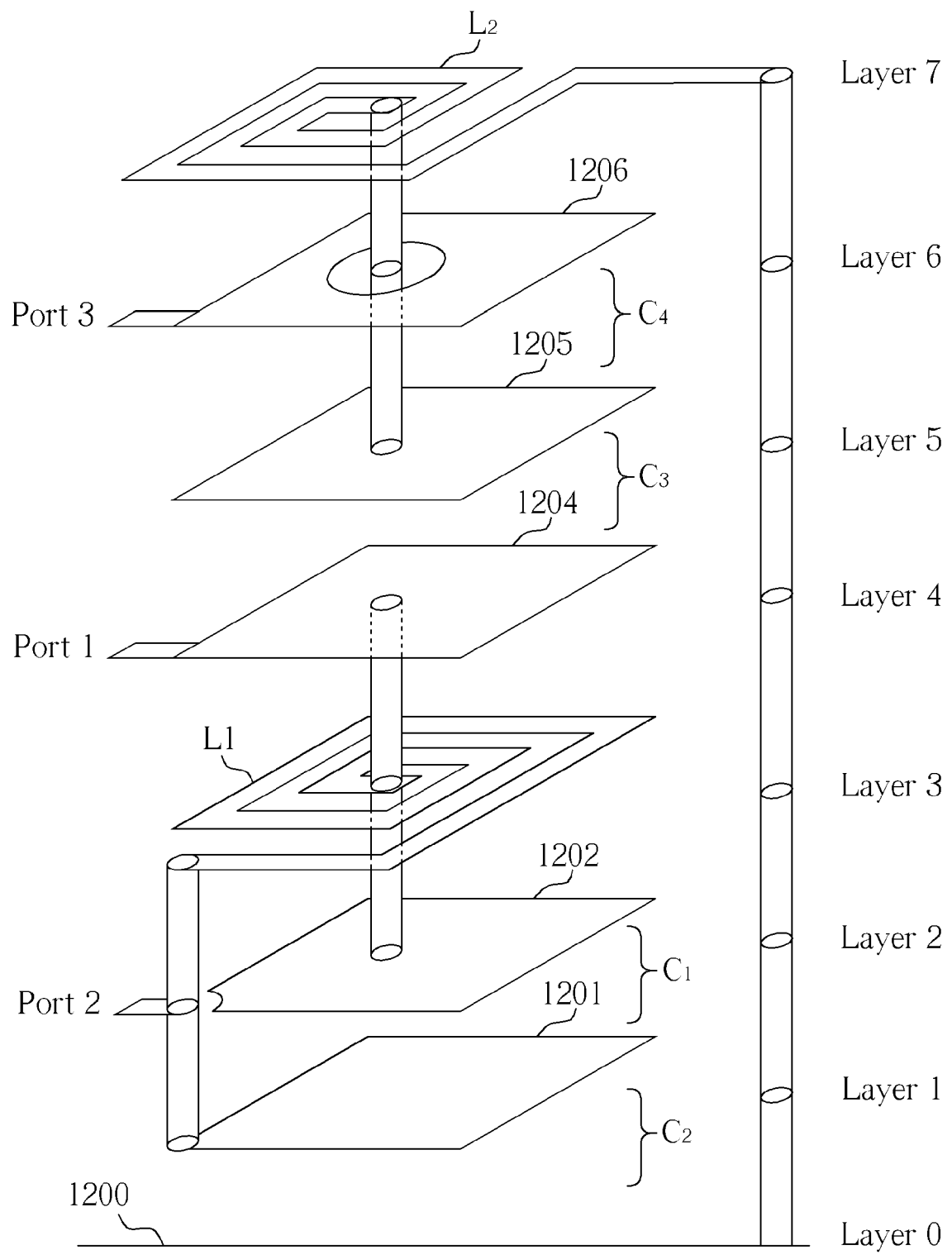
FIG. 12 shows a perspective view of the component layout for the diplexer embodiment of FIG. 10.

Shown in FIG. 12 is the perspective diagram of the first diplexer embodiment realized in a multi-layered substrate. Here, the inductors, L1 & L2 as featured in FIG. 10, are realized in the form of spiral-shaped metal strips, while the capacitors, C1–C4 also as featured in FIG. 10, are formed between metal plates, 1200–1202 and 1204–1206, on different layers. Specifically: the ground plate 1200 is formed on Layer 0, the first capacitor plate 1201 is formed on Layer 1, the second capacitor plate 1202 is formed on Layer 2, the first strip inductor L1 is formed on Layer 3, the third capacitor plate 1204 is formed on Layer 4, the fifth capacitor plate 1205 is formed on Layer 5, the sixth capacitor plate 1206 is formed on Layer 6, and the second strip inductor L2 is formed on Layer 7. The circuit elements for the low-pass 1010 and high-pass 1020 sections featured in FIG. 10 are arranged vertically to minimize the circuit area, with one inductive or capacitive circuit element on each layer. Therefore, the required circuit area on each layer can be reduced as compared to prior art embodiments (U.S. Pat. No. 5,880, 649, U.S. Pat. No. 6,097,268, and U.S. Pat. No. 6,677,833). Note that the metal plate 1204 on Layer 4, which is the bottom plate of the capacitor C3 for the high-pass section 1020, provides proper separation of the high-pass 1010 and low-pass 1020 sections. In contrast to a prior art embodiment (U.S. patent application Ser. No. 2003/0058063, which is included herein by reference) that recites the use of ground plates to separate the circuit elements, the diplexer of the present invention does not use ground plates for element separation and thus requires less circuit size, nor does it suffer detrimental effects from parasitic capacitance with respect to ground, which in general is difficult to quantify and eliminate from the circuit layout. Rather, the present invention, by virtue of its layout, ensures that parasitic capacitance is only likely to occur where it will have the least detrimental effect on circuit operation and, allows parasitic capacitance to be accommodated by the trimming of realized capacitors to achieve equivalence to the original required values. For example, the parasitic capacitance between the strip inductor L1 on Layer 3 and the second capacitor plate 1202 on Layer 2 can be absorbed into C1, while the parasitic capacitance between the strip inductor L1 on Layer 3 and the third capacitor plate 1204 on Layer 4 can also be added to C1. Moreover, the parasitic capacitance between the strip inductor L2 on Layer 3 and the fifth capacitor plate 1206 on Layer 7 can be absorbed into C4.

Figure 13:
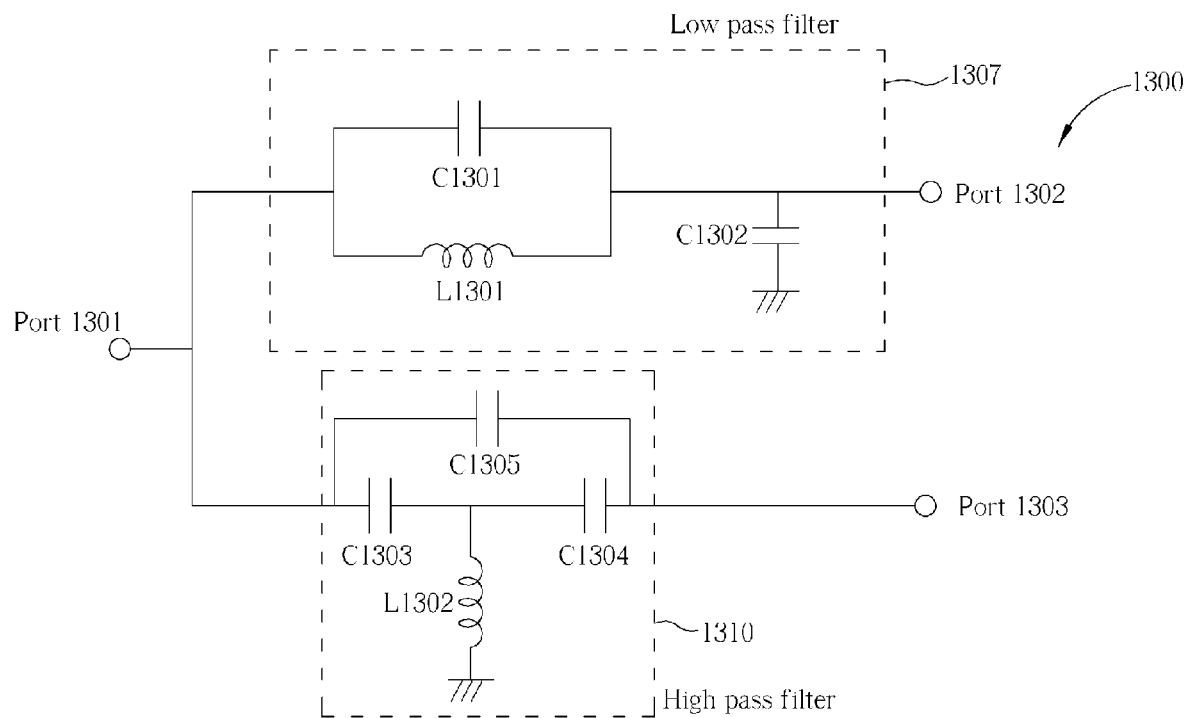
FIG. 13 shows a circuit diagram of a circuit model for another embodiment of the present invention.

Shown in FIG. 13 is the circuit model of a second diplexer embodiment 1300, with an additional coupling capacitor C1305 between the input and output nodes of a high-pass section 1310. Like the diplexer circuit of the first embodiment, it comprises a low-pass section 1307 and a high-pass section 1310 that are connected to a common terminal Port 1301, so as to separate a low frequency band from a high frequency band, given a mixed signal input. The low-pass section 1307, being connected between the common terminal Port 1301 and a low frequency output terminal Port 1302, includes a parallel LC resonant circuit comprising a capacitor C1301 and an inductor L1301, followed by a shunt capacitor C1302. The high-pass filter 1310, being connected between the common terminal Port 1301 and a high frequency output terminal Port 1303, includes two series capacitors, C1303 & C1304, together with an intermediately placed shunt inductor L1302 and a by-pass capacitor C1305 in parallel to the series capacitors C1303 & C1304. The additional capacitor C1305 is used to generate an additional notch in the insertion loss response of a high-pass filter 1310, such that the rejection performance of the second diplexer embodiment 1300 may further be enhanced.

Figure 14:
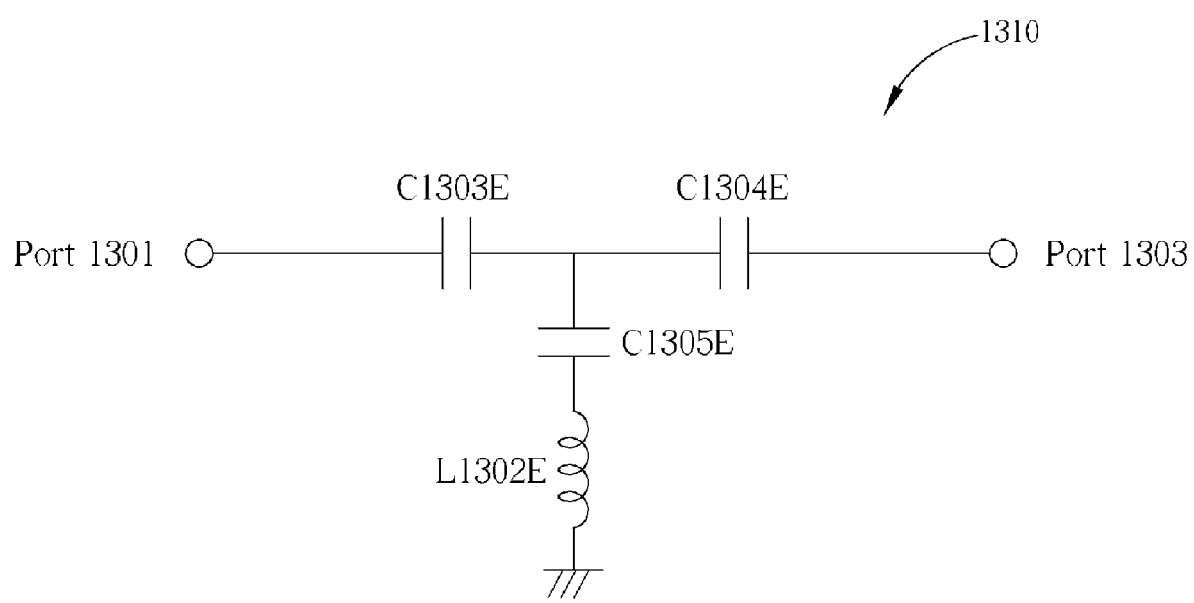
FIG. 14 shows a circuit diagram of an equivalent circuit model for the high-pass filter section of the embodiment of FIG. 13

Shown in FIG. 14 is the equivalent-circuit model for the high-pass filter 1310 of the diplexer 1300 featured in FIG. 13. Here the effect of the coupling capacitor C1305 of FIG. 13 can be modeled by an additional capacitor C1305E connected in series with an inductor L1302E such that the series resonance of the inductor L1302E and the capacitor C1305E will create an additional notch in the insertion loss response.

Figure 15:
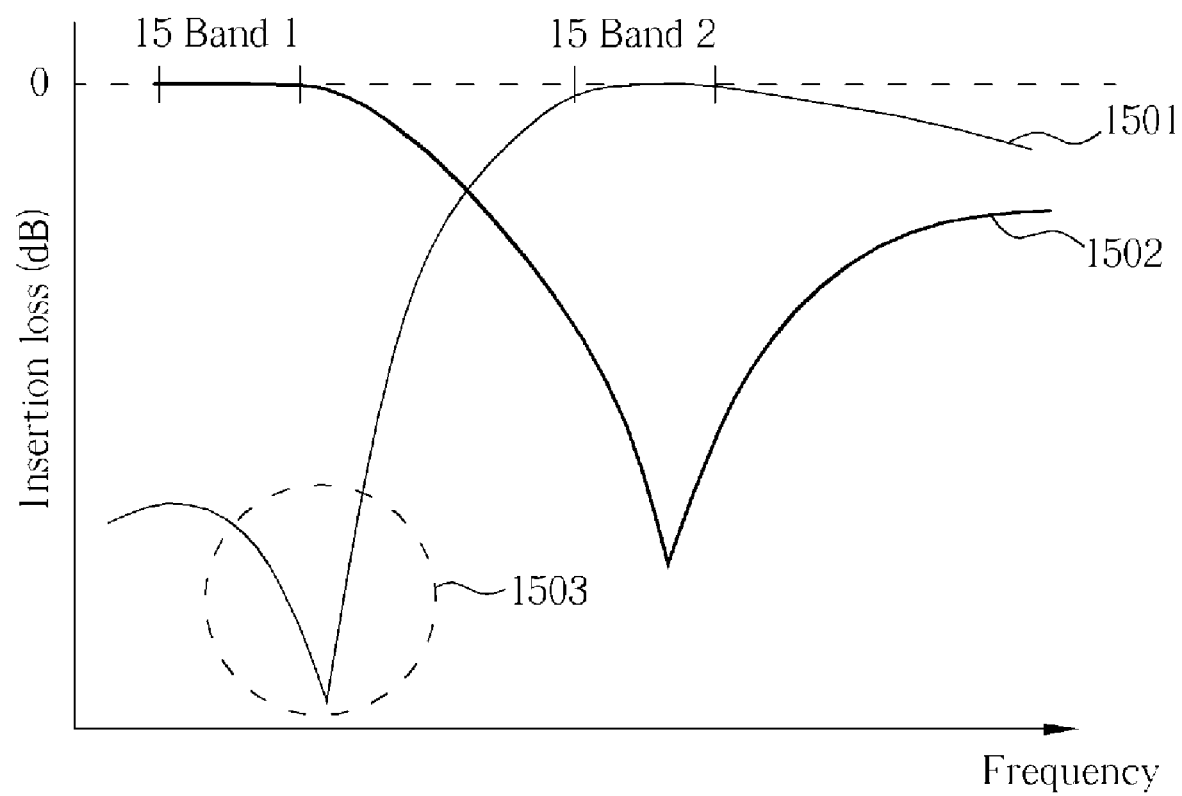
FIG. 15 shows a graph of typical frequency response of the diplexer embodiment of FIG. 13.
Figure 16:
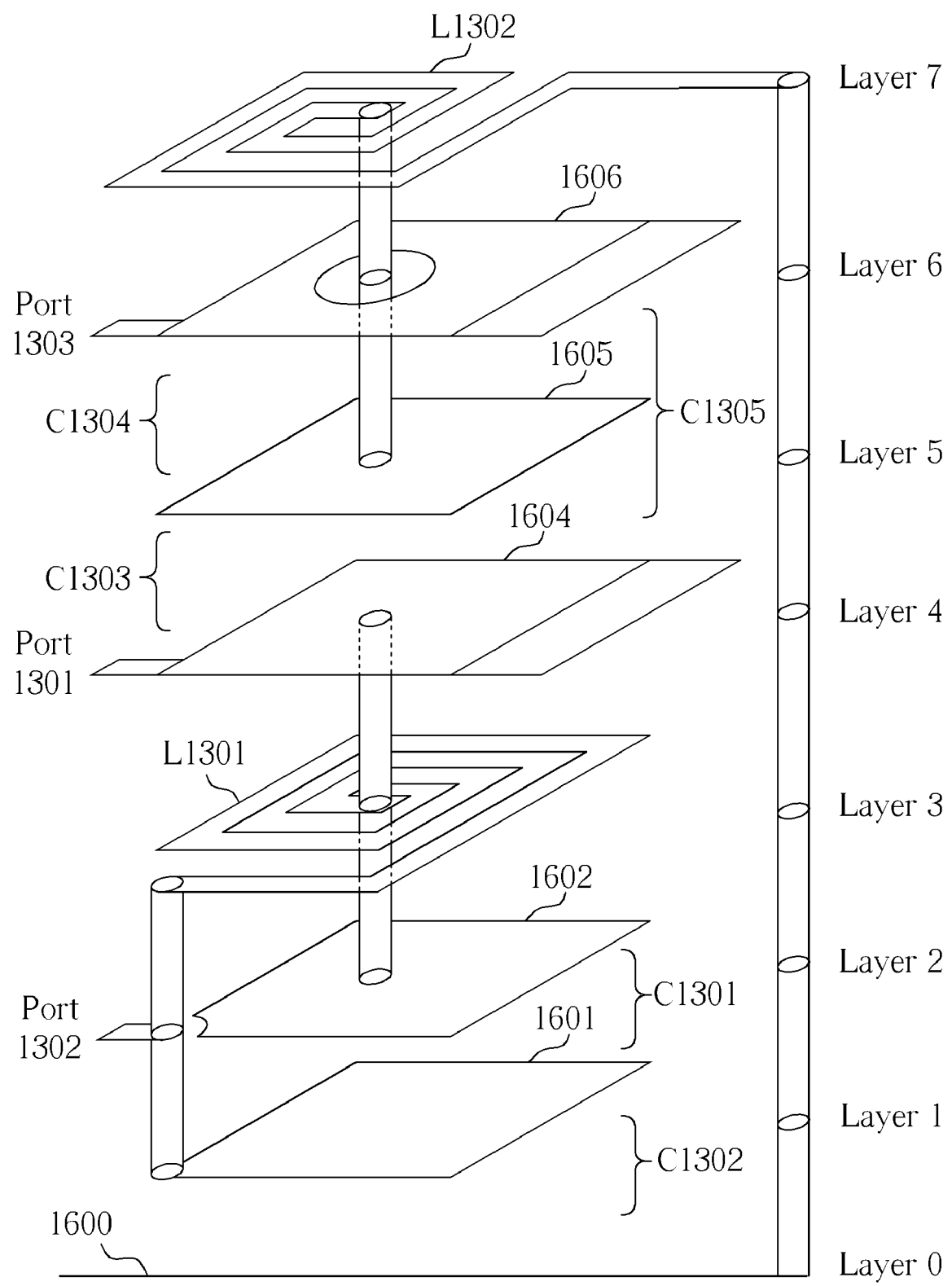
FIG. 16 shows a perspective view of the component layout for the diplexer embodiment of FIG. 13.

Shown in FIG. 15 is a typical frequency response of the diplexer embodiment 1300 featured in FIG. 13. With the additional capacitor C1305, a notch 1503 at low frequency in an insertion loss response 1501 of the high-pass section 1310 is created, such that isolation is further improved. A perspective diagram of the diplexer embodiment 1300 featured in FIG. 13, again realized in a multi-layered substrate, is shown in FIG. 16. Here, the inductors, L1301 & L1302 as featured in FIG. 13, are realized in the form of spiral-shaped metal strips, while the capacitors, C1301–C1305 also as featured in FIG. 13, are formed between metal plates, 1600–1602 and 1604–1606, on different layers. The arrangement of circuit elements is basically the same as those in FIG. 12. Specifically: the ground plate 1600 is formed on Layer 0, the first capacitor plate 1601 is formed on Layer 1, the second capacitor plate 1602 is formed on Layer 2, the first strip inductor L1301 is formed on Layer 3, the third capacitor plate 1604 is formed on Layer 4, the fifth capacitor plate 1605 is formed on Layer 5, the sixth capacitor plate 1606 is formed on Layer 6, and the second strip inductor L1302 is formed on Layer 7. The additional notch 1503 is realized by enlarging metal plates 1604 & 1606 on Layer 4 and Layer 6 respectively, of the diplexer structure in FIG. 16, such that the coupling capacitance C1305 is conveniently realized. As a result, improvements in diplexer performance can be achieved in a device with almost the same circuit area as the device of FIG. 12, while retaining the virtues of smaller circuit size and reduced parasitic effects, as featured in the device of FIG. 12.

The present invention diplexer embodiments are realizable in very compact packages, due to the adoption of lumped-elements in the design and the vertical arrangement of circuit elements. In this sense, vertical is taken to refer to the contiguous stacking of parallel circuit elements, building from the ground plane, Layer 0, outwards, thus forming a columniform structure about a perpendicular of the ground plane, hence it is used in relative terms and is not intended to limit the absolute or relative (to other objects) attitude of the ground plane. The specified diplexers of the present invention are preferably realized in a multi-layered substrate, such as a low temperature co-fired ceramic (LTCC) substrate. For the circuits in all the above embodiments, the spiral inductors are of a (but not limited to) single arm, Archimedean pattern and can be rectangular, circular, or octagonal in shape for example. In addition, the inductors/capacitors can also occupy more than one layer for realizing larger inductance/capacitance values or for reducing the required circuit area on each layer. Compared to the prior art, the present invention diplexer embodiments make more efficient use of the multi-layered substrate such that they may better fit the stringent requirements on size and cost relating to modern handheld wireless communication devices.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A lumped-element diplexer implemented in a multi-layered substrate comprising:
   a low-pass filter circuit comprising:
      a first capacitor plate disposed on a first layer of the multi-layered substrate;
      a second capacitor plate disposed on a second layer of the multi-layered substrate; and
      a first inductor plate directly disposed on a third layer of the multi-layered substrate;
   a high-pass filter circuit, the high-pass filter circuit comprising:
      a third capacitor plate disposed on a fourth layer of the multi-layered substrate;
      a fourth capacitor plate disposed on a fifth layer of the multi-layered substrate;
      a fifth capacitor plate disposed on a sixth layer of the multi-layered substrate; and
      a second inductor plate directly disposed on a seventh layer of the multi-layered substrate; and
   a ground plane forming a base of the multi-layered substrate,
      wherein circuit elements of the low-pass filter circuit are disposed on a first series of layers of the multi-layered substrate, a first end of the low-pass filter circuit is connected to a first port and a second end of the low-pass filter circuit is connected to a second port, circuit elements of the high-pass filter circuit are disposed on a second series of layers of the multi-layered substrate, a first end of the high-pass filter circuit, is connected to the first port and a second end of the high-pass filter circuit is connected to a third port, elements of the filter circuits are orientated horizontally with respect to the ground plane and are arranged in layers aligned substantially vertically, these layers being separated by a dielectric material and inter-layer connections being implemented by at least a via, and no layer is between an uppermost layer of the first series of layers of the multi-layered substrate and a lowermost layer of the second series of layers of the multi-layered substrate.

2. The lumped-element diplexer implemented in a multi-layered substrate of claim 1, wherein the circuit elements of the filter circuits comprise inductive elements that comprise plates formed as spirals.

3. The lumped-element diplexer implemented in a multi-layered substrate of claim 1, wherein the circuit elements of the filter circuits comprise at least one inductive element formed on a plurality of layers of the multi-layered substrate.

4. The lumped-element diplexer implemented in a multi-layered substrate of claim 1, wherein the circuit elements of the filter circuits comprise at least one capacitive element comprising a plurality of plates formed on a plurality of layers of the multi-layered substrate.

5. The lumped-element diplexer implemented in a multi-layered substrate of claim 1, wherein the high-pass filter circuit further comprises a low frequency notch filter circuit.

6. The lumped-element diplexer implemented in a multi-layered substrate of claim 1, wherein at least the third and fifth capacitor plates are dimensioned to have additional overlapping area in order to realize an additional capacitor equivalence.

7. The lumped-element diplexer implemented in a multi-layered substrate of claim 1, wherein the ground plane forms a zeroth layer of the lumped-element diplexer.

8. The lumped-element diplexer implemented in a multi-layered substrate of claim 1, wherein the device is realized in a multi-layered, low temperature co-fired ceramic substrate.

9. A lumped-element diplexer implemented in a multi-layered substrate comprising:
   a low-pass filter circuit comprising:
      a first capacitor plate disposed on a first layer of a first series of layers of the multi-layered substrate;
      a second capacitor plate disposed on a second layer of the first series of layers of the multi-layered substrate; and
      a first inductor plate directly disposed on a third layer of the first series of layers of the multi-layered substrate;
   wherein the first capacitor plate is connected to a first port, the second capacitor plate is connected to a first end of the first inductor plate and to a second port via a third capacitor plate of a high-pass filter circuit of the lumped-element diplexer, and a second end of the first inductor plate is connected to the first port;
   a high-pass filter circuit comprising:
      a third capacitor plate disposed on a first layer of a second series of layers of the multi-layered substrate;
      a fourth capacitor plate disposed on a second layer of the second series of layers of the multi-layered substrate;
      a fifth capacitor plate disposed on a third layer of the second series of layers of the multi-layered substrate; and
      a second inductor plate directly disposed on a fourth layer of the second series of layers of the multi-layered substrate;
   wherein the third capacitor plate is connected to the second port, the fourth capacitor plate is connected to a first end of the second inductor plate, the fifth capacitor plate is connected to a third port and a second end of the second inductor plate is connected to a ground plane of the lumped-element diplexer, and wherein the high-pass filter circuit further comprises a low frequency notch filter circuit realized by additional overlapping area of the third and fifth capacitor plates; and
   a ground plane forming a base of the multi-layered substrate, wherein elements of the filter circuits are orientated horizontally with respect to the ground plane and are arranged in layers aligned substantially vertically, these layers being separated by a dielectric material and inter-layer connections being implemented by at least a via;
   wherein no layer is between an uppermost layer of the first series of layers of the multi-layered substrate and a lowermost layer of the second series of layers of the multi-layered substrate.

10. The lumped-element diplexer implemented in a multi-layered substrate of claim 9, wherein an inductor plate comprises a spiral-shaped metal strip.

11. The lumped-element diplexer implemented in a multi-layered substrate of claim 9, further comprising at least one inductive element formed on a plurality of layers of the multi-layered substrate.

12. The lumped-element diplexer implemented in a multi-layered substrate of claim 9, further comprising at least one capacitive element formed on a plurality of layers of the multi-layered substrate.

13. The lumped-element diplexer implemented in a multi-layered substrate of claim 9, wherein the ground plane forms a zeroth layer of the lumped-element diplexer.

* * * * *